United States Patent
Iida

[11] Patent Number: 5,392,237
[45] Date of Patent: Feb. 21, 1995

[54] SEMICONDUCTOR MEMORY DEVICE WITH EEPROM IN TRENCH WITH POLYSILICON/METAL CONTACTING TO SOURCE AND DRAIN IN VIRTUAL GROUND TYPE ARRAY

[75] Inventor: Kunio Iida, Kyoto, Japan

[73] Assignee: Rohm Co., Ltd., Kyoto, Japan

[21] Appl. No.: 96,995

[22] Filed: Jul. 27, 1993

[30] Foreign Application Priority Data

Sep. 25, 1992 [JP] Japan .................. 4-256809

[51] Int. Cl.⁶ .............................................. G11C 11/40
[52] U.S. Cl. .................................. 365/185; 365/63; 365/72; 257/316; 257/384; 257/385; 257/755; 257/756
[58] Field of Search ............... 365/185, 52, 63, 72; 257/244, 315, 316, 382, 384, 385, 755, 756

[56] References Cited

U.S. PATENT DOCUMENTS

| | | | |
|---|---|---|---|
| 4,128,670 | 12/1978 | Gaensslen | 257/755 |
| 4,488,166 | 12/1984 | Lehrer | 257/755 |
| 4,700,215 | 10/1987 | McPherson | 257/755 |
| 4,774,556 | 9/1988 | Fujii et al. | 257/316 |
| 4,795,722 | 1/1989 | Welch et al. | 257/755 |
| 4,929,988 | 5/1990 | Yoshikawa | 257/316 |
| 4,979,004 | 12/1990 | Esquivel et al. | 365/185 |
| 5,017,977 | 5/1991 | Richardson | 365/185 |
| 5,053,842 | 10/1991 | Kojima | 365/185 |
| 5,078,498 | 1/1992 | Kadakia et al. | 257/316 |
| 5,146,426 | 9/1992 | Mukherjee et al. | 365/185 |
| 5,258,634 | 11/1993 | Yang | 365/185 |

FOREIGN PATENT DOCUMENTS

| | | | |
|---|---|---|---|
| 2-113532 | 4/1990 | Japan | 257/755 |
| 4-10465 | 1/1992 | Japan | 257/384 |

OTHER PUBLICATIONS

D. Campbell et al., "Enhanced Polycide Structures," IBM Tech. Discl. Bull., vol. 25 #4, Sep. 1982, pp. 1920–1921.

Primary Examiner—Joseph E. Clawson, Jr.
Attorney, Agent, or Firm—Nikaido, Marmelstein, Murray & Oram

[57] ABSTRACT

Provided is a semiconductor memory device wherein nonvolatile memory elements are arranged in a matrix configuration, each of the memory elements having a field effect transistor including a floating gate, an interlayer insulating film and a control gate electrode which are stacked on an insulating film covering a semiconductor substrate, and a source region and a drain region which are respectively formed in the semiconductor substrate on both sides of the gate electrode, the floating gate, interlayer insulating film and control gate electrode being formed in a recess provided in the semiconductor substrate. The semiconductor device of such a structure is reduced in size and highly integrated with its high-performance characteristics maintained.

3 Claims, 12 Drawing Sheets

SEMICONDUCTOR MEMORY DEVICE WITH EEPROM IN TRENCH WITH POLYSILICON/METAL CONTACTING TO SOURCE AND DRAIN IN VIRTUAL GROUND TYPE ARRAY

FIELD OF THE INVENTION

The present invention relates to a semiconductor memory device provided with a nonvolatile memory element, such as flash memory and flash microcomputer.

BACKGROUND OF THE INVENTION

In a conventional semiconductor memory device a plurality of memory elements are arranged in the transverse direction and vertical direction, in other words, arranged in a matrix. There is such a device wherein the drain regions of the memory elements lying transversely are connected with one another by means of a bit line, the gate electrodes of the memory elements lying vertically are connected with one another by means of a word line and the source regions of the memory elements are connected with one another by means of a source line. Writing of data in or reading out of data from a desired cell is performed by selecting a specific bit line and a specific word line with an input/output control circuit or the like.

In order to realize a higher integration of such a semiconductor memory device there is a need to make each memory element smaller or shorten the distance between adjacent bit lines and that between adjacent word lines.

FIG. 21 is a plan view showing a conventional semiconductor memory device. FIGS. 22 and 23 are sectional views taken along a line X—X and a line Y—Y, respectively in FIG. 21.

Referring to these figures, a source line SL through which source regions 102 lying between memory elements 101 are connected with one another ( one source region is common to any two elements adjacent thereto) is made of a diffusion layer. Hence, if the marginal edge of the source line SL overlaps the edge of a word line WL, a coupling ratio would vary. For this reason there is required to provide a margin M1 (refer to FIG. 21), which results in an increased distance between adjacent word lines between which the source line SL is interposed.

In addition, there is a need to provide an alignment margin M2 between a drain contact 104 and the word line WL (refer to FIG. 21) so as to prevent a short circuit between word line WL and bit line BL. This also results in an increased distance between word lines between which the drain contact 104 is interposed.

On the other hand, if a size of memory elements is made to be small, a gate electrode of each element becomes small and a capacitance $C_1$ based on an interlayer insulating film 106 which is sandwiched between a floating gate 105 and a control gate electrode 107 also becomes small. Although a voltage is applied to the control gate electrode to operate the memory element, the voltage which contributes to the operation is a voltage applied to the floating gate. This voltage is subject to a coupling ratio, which is a relationship between the capacitance $C_1$ based on the aforesaid interlayer insulating film 106 and a capacitance $C_2$ based on a gate insulating film which is interposed between the floating gate 105 and a semiconductor substrate 10. That is, the coupling ratio is found from $C_1/(C_1+C_2)$. Therefore, the larger the value $C_1$ relative to the value $C_2$ increases, the larger the coupling ratio increases, hence, the more effectively the floating gate can be applied with a voltage. In order to obtain a larger coupling ratio, the floating gate 105 needs to be elongated in the direction perpendicular to the bit line BL. Accordingly, the floating gate becomes longer in such a direction than the width W of an active region. This also results in a problem of an increased distance between adjacent bit lines. Further, since the width W of the active region needs to be sufficiently large in a region where the drain contact is formed, it is impossible to make the width W smaller throughout the active region.

As described above, with the conventional configuration there is a limitation in high integration of a semiconductor memory device.

SUMMARY OF THE INVENTION

The present invention has been attained to resolve the foregoing problems. Thus, it is an object of the present invention to provide a semiconductor nonvolatile memory device of high integration which is microminiaturized by making the distance between adjacent bit lines and between adjacent word lines, smaller and wherein a large coupling ratio of each memory element is maintained.

It is another object of the present invention to provide a semiconductor nonvolatile memory device in which each memory element has a shortened gate length without degradation of the characteristics thereof and which offers a shortened access time.

According to the present invention, there is provided a semiconductor memory device comprising a plurality of nonvolatile memory elements arranged in a matrix configuration. Each of the memory elements has a field effect transistor including a floating gate, an interlayer insulating film and a control gate electrode which are sequentially stacked on an insulating film covering a semiconductor substrate. A source region and a drain region are respectively formed in the semiconductor substrate on both sides of the gate electrode. The stacked floating gate, interlayer insulating film and control gate electrode being formed in a recess provided in the semiconductor substrate.

The semiconductor memory device acccording to the present invention preferably has a three-layered polysilicon structure including a first polysilicon film forming a source line over the source regions of the nonvolatile memory elements arranged vertically or transversely, through which source line over the source regions are connected with one another. A second polysilicon film forms the floating gate of each of the memory elements. A third polysilicon film forms a word line through which the control gate electrodes of the memory elements arranged vertically or transversely are connected with one another.

Further, it is preferable that the first and/or third polysilicon films are of a three-layered structure including doped polysilicon, tungsten silicide and polysilicon.

According to the present invention, there is also provided a method for manufacturing a semiconductor memory device including steps of: defining active regions by dividing a semiconductor substrate with a field oxide film formed to extend vertically or transversely; forming a first polysilicon film on a surface of the semiconductor substrate; patterning the first polysilicon film and etching a gate formation region of the semiconductor substrate to form a recess; forming an oxide film for covering a whole surface of the recess by oxidizing the semiconductor substrate; sequentially stacking a second polysilicon film and an interlayer insulating film, which are then patterned to have a belt-like shape through which elements on the active regions are connected with one another; forming a third polysilicon film, which is then etched and patterned on source regions to have a belt-like shape through which elements arranged vertically or transversely are connected with one another; oxidizing a surface of the third polysilicon film and the polysilicon films which are exposed due to the previous patterning, and then etching the third polysilicon film, interlayer insulating film and second polysilicon film which are stacked on drain regions to form a word line through which control gate electrodes of the elements arranged vertically or transversely are connected with one another; and forming a bit line composed of a metal interconnection line through which drain electrodes formed of the first polysilicon film lying on the drain regions of the elements arranged vertically or transversely are connected with one another.

Further, it is preferable that the bit line is formed by forming contact holes into the oxide film covering the first polysilicon film which lies on the drain regions in a self-alignment manner utilizing a side spacer and connecting the contact holes with one another through the metal interconnection line.

In the semiconductor memory device having nonvolatile memory elements arranged in a matrix configuration according to the present invention, the gate region is formed on the bottom surface of the recess which is formed in the semiconductor substrate thereby forming a three-dimensional structure. Hence, the capacitance of the interlayer insulating film sandwiched by the floating gate and the control gate electrode can be made larger, which leads to a larger coupling ratio. As a result, each of the memory elements can be reduced in size, while at the same time the distance between adjacent word lines and that between adjacent bit lines can be shortened.

DETAILED DESCRIPTION

Figure 1:
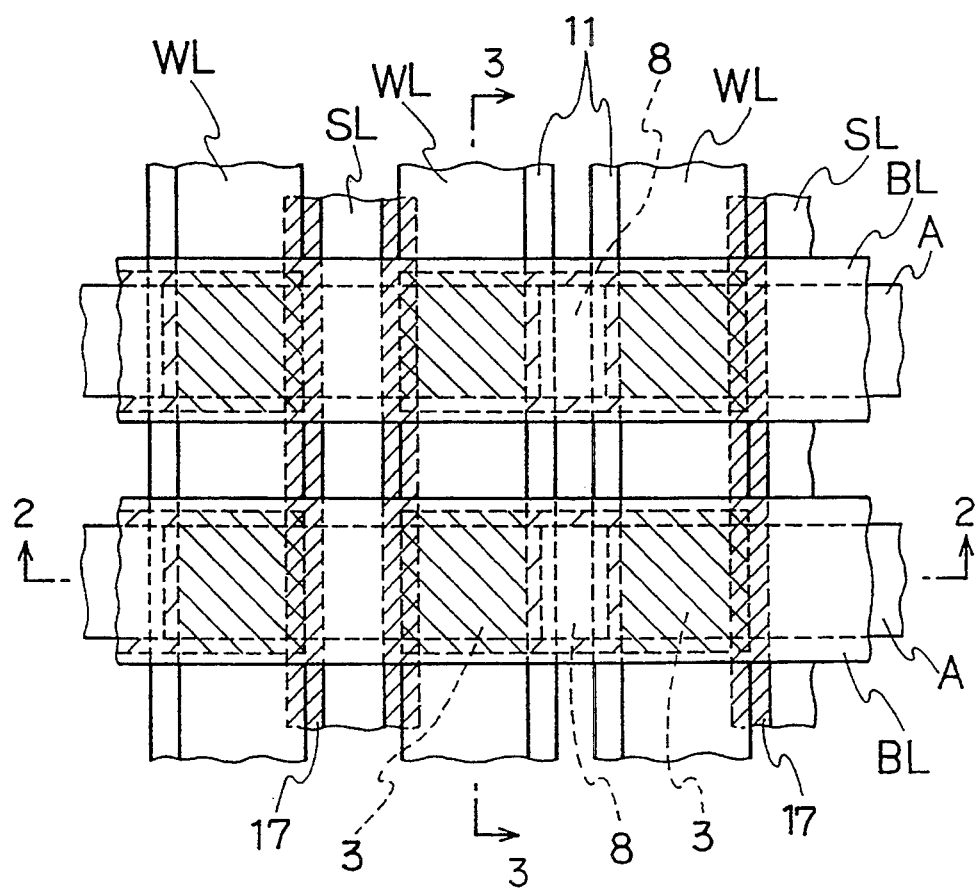
FIG. 1 is an explanatory plan view showing an embodiment of the semiconductor device according to the present invention.
Figure 2:
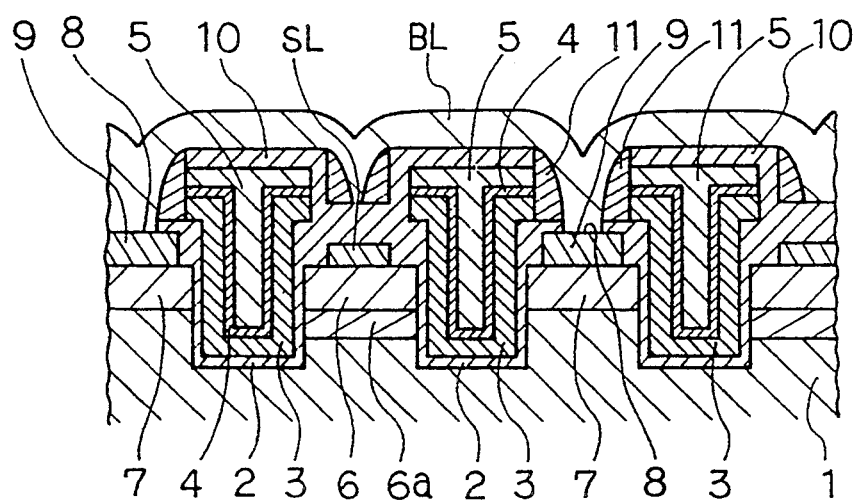
FIG. 2 is an explanatory sectional view taken along a line X—X in FIG. 1.
Figure 3:
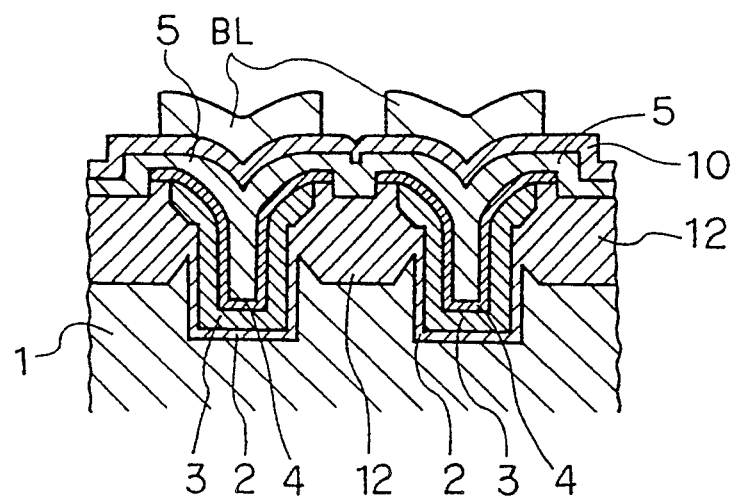
FIG. 3 is an explanatory sectional view taken along a line Y—Y in FIG. 1.

The present invention will be described by way of the embodiments thereof with reference to the drawings. FIG. 1 is a fragmentary plan view showing a part of an embodiment of the semiconductor memory device having nonvolatile memory elements arranged in a matrix configuration according to the present invention. FIG. 2 is a sectional view taken along a line X—X in FIG. 1, and FIG. 3 is also a sectional view taken along a line Y—Y in FIG. 1.

This embodiment is characterized in that a gate region is formed in a semiconductor substrate 1. Preferably, the gate region is formed at a depth larger than the depth of a source region 6 or a drain region 7. To this end, in the present embodiment a gate insulating film 2, a floating gate 3 composed of a second polysilicon film, an interlayer insulating film 4 and a control gate electrode 5 are sequentially stacked on the surface of a recess formed in the semiconductor substrate 1. On both sides of these gates a source region 6 (including a low-concentration region 6a for enhancing the withstand voltage at the junction) and a drain region 7 are formed respectively. The source region 6 is common to the two memory elements adjacent thereto.

On the source region 6 is provided a source line SL formed of a first polysilicon film, through which source line over the source regions of the memory elements arranged transversely are connected with one another. On the other hand a drain electrode 9 formed of the first polysilicon film is provided on the drain region 7. The source region 6 and drain region 7 are formed by impurity diffusion from the first polysilicon film. The drain electrodes 9 of the memory elements arranged vertically in connection with the first polysilicon film lying on the drain regions 7 are connected with one another through a bit line BL formed of a metal interconnection line which extends over an insulating film 10 formed on the control gate electrodes 5. In forming the bit line BL a side spacer 11 is formed so that a drain contact 8 would be formed in a self-alignment manner.

In the present invention there is no need to provide an alignment margin between the source line SL and the word line WL since the source line SL is formed of a polysilicon film. Accordingly, the distance between the source line SL and the word line WL is small as compared with that in the conventional memory device. In addition the distance between adjacent word lines between which the drain contact 8 is interposed is also small as compared with that in the conventional memory device. This is because the formation of the side spacer 11 makes it possible to form the drain contact 8 in a self-alignment manner and, hence, there is no need to provide an aligment margin for forming the drain contact 8.

It is preferable to reduce the size of each memory cell itself so as to realize a semiconductor memory device of higher integration. If the memory cell is reduced in size, the area of the interlayer insulating film 4 becomes small, hence, decreasing the coupling ratio. For avoiding a decrease in the coupling ratio the interlayer insulating film 4 needs to be made thin. With a thin interlayer insulating film, leakage due to pinholes is likely, which degrades the reliability of the device. Therefore, as shown in FIGS. 2 and 3, the gate electrode portion is formed into so-called a trench structure so as to enlarge the area of the interlayer insulating film 4 thereby increasing the coupling ratio, while decreasing the width of each element thereby to realize a small-sized memory element.

With the memory cells thus reduced in size, the distance between adjacent bit lines is made smaller than that in the conventional device. In the present embodiment, since the source line is formed of a polysilicon film and, in addition, the drain contact is formed in self-aligment with the side spacer, a provision of an alignment margin is unnecessary and, hence, the distance between adjacent wiring lines can be made small. Thus, the memory device can be small-sized.

According to the present invention, a semiconductor memory device of higher integration than ever can be realized without degrading the reliability of each memory cell.

To be described next is an embodiment of the method for manufacturing a semiconductor nonvolatile memory device.

Figure 4:
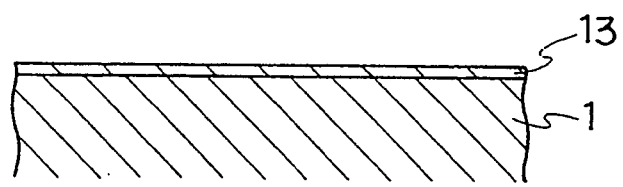
FIG. 4 is an explanatory plan view showing another embodiment of the present invention.
Figure 5:
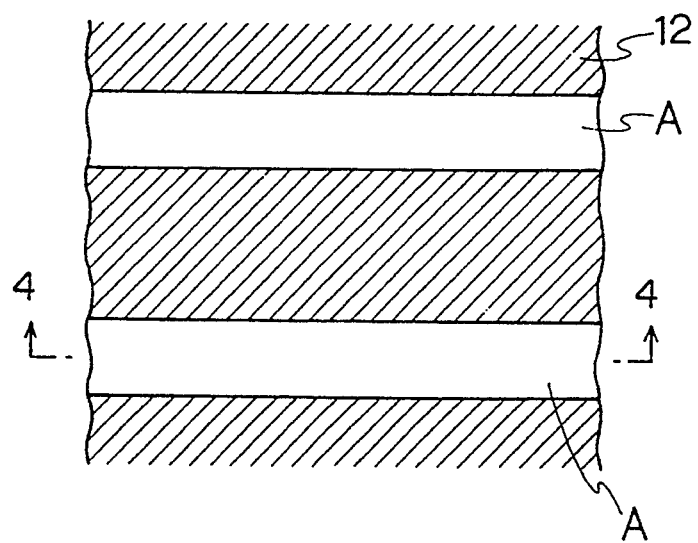
FIG. 5 is an explanatory sectional view taken along a line X—X in FIG. 4.

Firstly, an active region extending transversely is defined on a semiconductor substrate. In an exemplary case, using a conventional LOCOS (Local Oxidation of Silicon) technique an active region A covered with a thin oxide film 13 is defined on a p-type semiconductor substrate 1 and which is surrounded with a thick oxide film 12 and extends transversely, as shown in FIGS. 4 and 5. It should be noted that FIG. 4 is a sectional view taken along a line X—X in FIG. 5. In this case the distance between adjacent active regions A meets the lower limit specification (about 0.6 μm).

Figure 6:
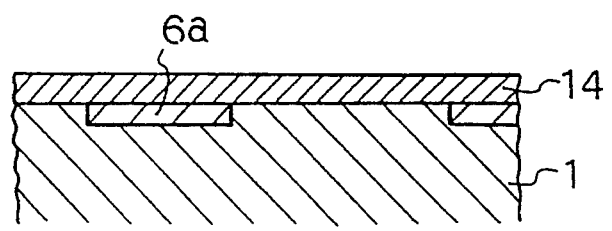
FIG. 6 is an explanatory plan view showing another embodiment of the present invention.
Figure 7:
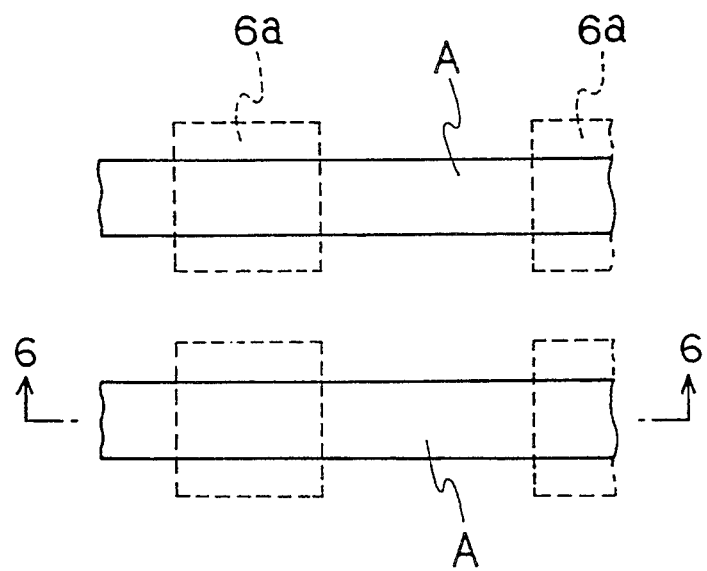
FIG. 7 is an explanatory sectional view taken along a line X—X in FIG. 6.

Next, a polysilicon film is formed over the whole surface. In the exemplary case, a source formation region ( enclosed with a broken line in FIGS. 6 and 7 is implanted with phosphorus ions to form a low-concentration region 6a therein. In this ion implantation there is no problem if a gate formation region is implanted with phosphorus ions. Thereafter, the thin oxide film 13 is removed, a first polysilicon film 14 is deposited over the whole surface, and arsenic ions are implanted into the first polysilicon film 14 at a high concentration (refer to FIGS. 6 and 7). It is worth noting that the first polysilicon film 14 can be of a three-layered structure of polysilicon/tungsten silicide/doped polysilicon so as to lower the resistance of a source line SL.

Figure 8:
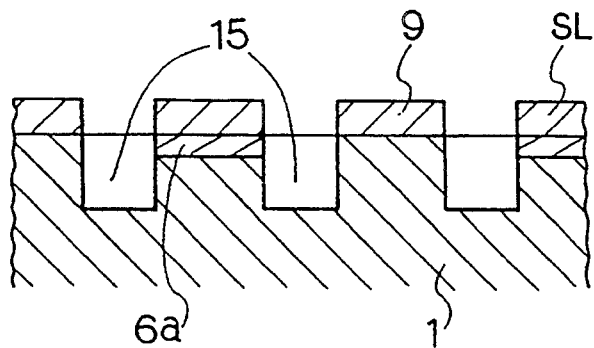
FIG. 8 is an explanatory plan view showing another embodiment of the present invention.
Figure 9:
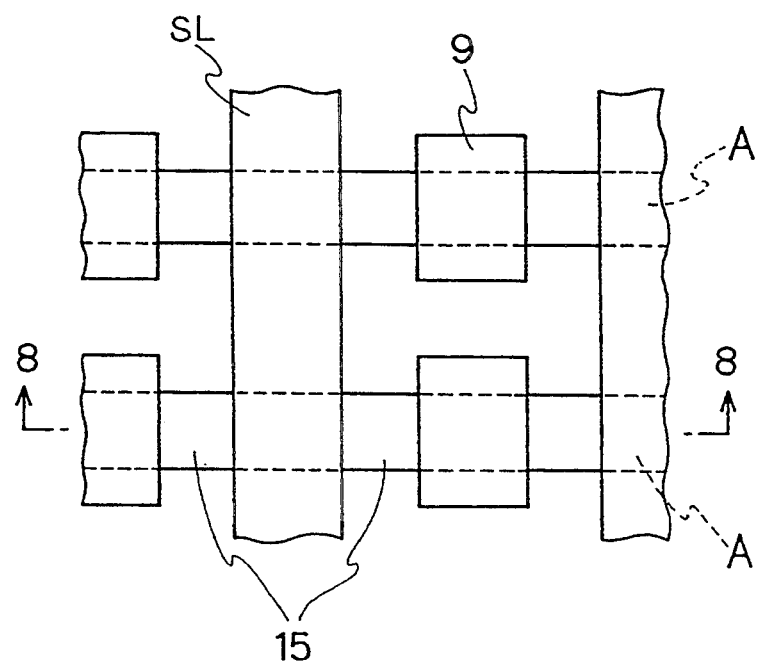
FIG. 9 is an explanatory sectional view taken along a line X—X in FIG. 8.

In turn, the first polysilicon film 14 is patterned, and the gate formation region is etched to form a recess therein. In the exemplary case, the first polysilicon 14 is masked with photoresist and patterned to form the source line SL and a drain electrode 9. Further, the silicon substrate 1 the gate formation region is etched with an anisotropic etching apparatus to form a recess 15. In this case the depth to be etched is preferably larger than the depth of impurity diffusion at the source region and drain region ( refer to FIGS. 8 and 9).

Figure 10:
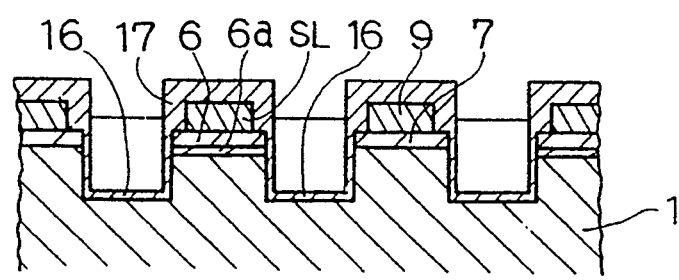
FIG. 10 is an explanatory sectional view showing another embodiment of the present invention.

Subsequently, an oxide film for covering whole surface of the recess (hereinafter referred to as "tunnel oxide film") is formed on the surface of the gate formation region. Specifically a tunnel oxide film 16 is formed so as to cover an inner surface of the recess 15 formed by etching the silicon substrate 1 in the preceding step. In the exemplary case, a silicon oxide film is formed by heating the whole silicon substrate at 850° to 900° C. for 10 to 20 minutes. In this case the first polysilicon film (including source line SL and drain electrode 9) which is heavily doped with phosphorus and the silicon substrate 1 are oxidized at different oxidation rates. Hence, although a thick oxide film 17 of 500 to 600 Å thickness is formed around the first polysilicon film, a thin oxide film of about 100 Å thickness which becomes the tunnel oxide film 16 is formed in the recess 15. In this heat treatment the impurity contained in the first polysilicon film is diffused into the silicon substrate 1, forming the source and drain regions 6 and 7. Thereafter, ion implantation is carried out to adjust the threshold voltage $V_{th}$ (refer to FIG. 10).

Figure 11:
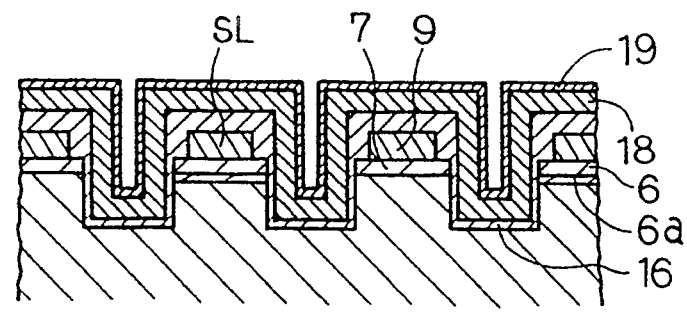
FIG. 11 is an explanatory sectional view showing another embodiment of the, present invention.

In turn, a floating gate and an interlayer insulating film are formed, followed by patterning. In the exemplary case, a second polysilicon film 18, which will form a floating gate, is deposited over the whole surface and doped with phosphorus at a low concentration. On the whole second polysilicon film 18 is formed the interlayer insulating film 19 consisting of a silicon oxide film and a silicon nitride film. Here, since the interlayer insulating film 19 is formed on the inner surface of the recess 15 as shown in FIG. 11, the area of the interlayer insulating film 19 is relatively large and, hence, the coupling ratio can be increased. Thus, even if each memory element is reduced in size, the capacitance of the interlayer insulating film 19 between the control gate electrode and the floating gate can be increased so as to obtain an increased coupling ratio without making the interlayer insulating film 19 thinner than necessary and without degrading the reliability of the memory device.

Figure 12:
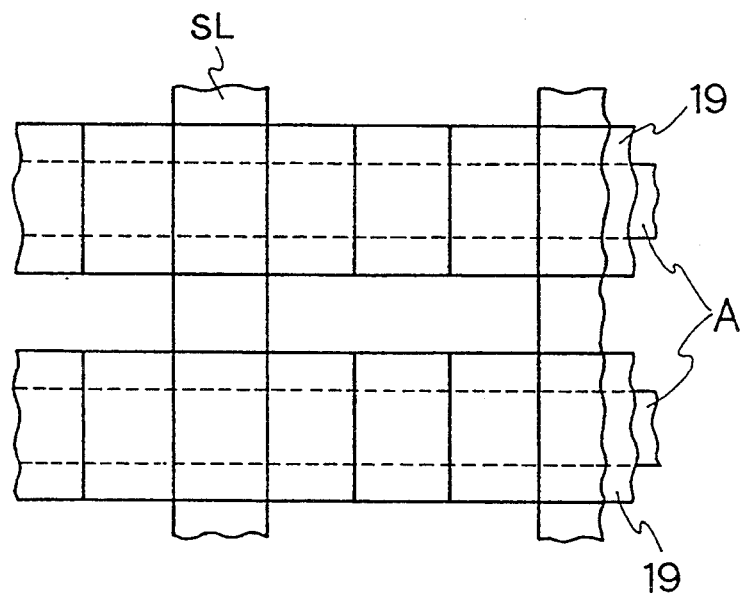
FIG. 12 is an explanatory plan view showing another embodiment of the present invention.

Subsequently, etching is performed so as to retain the second polysilicon film 18 and interlayer insulating film 19 on the active region A, followed by oxidation (refer to FIG. 12).

Figure 13:
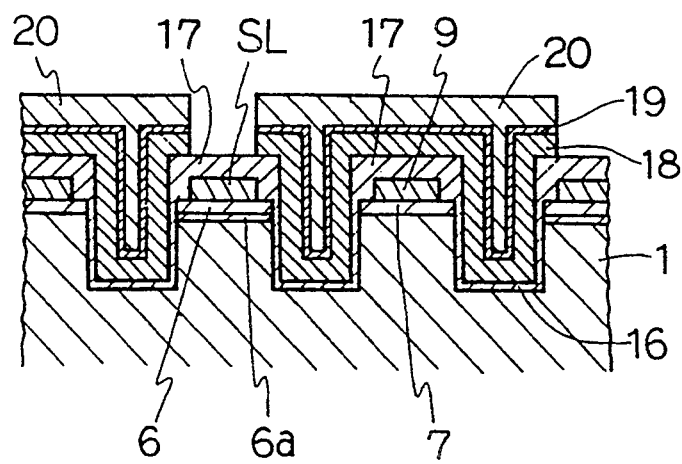
FIG. 13 is an explanatory plan view showing another embodiment of the present invention.
Figure 14:
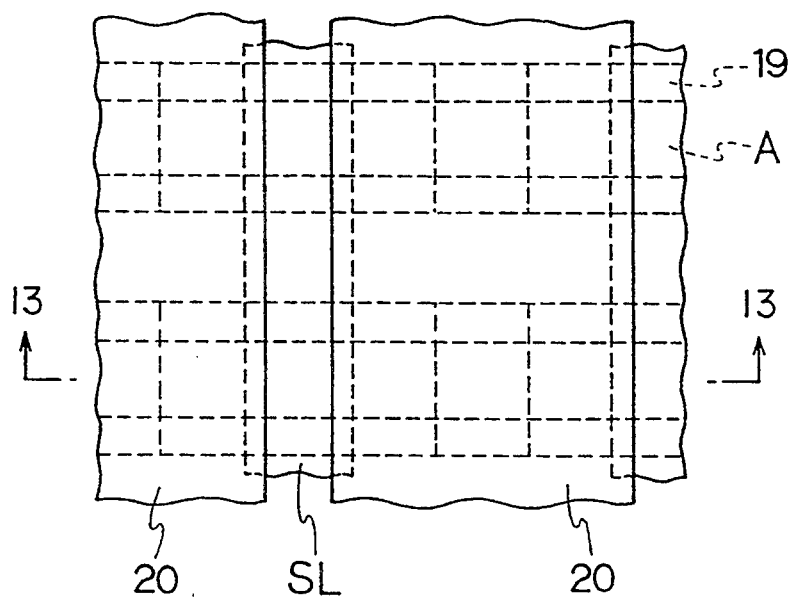
FIG. 14 is an explanatory sectional view taken along a line X—X in FIG. 13.

In turn, a third polysilicon film, which will form the control gate, is deposited over the entire surface and patterned by etching on the source region 6 so as to connect the elements arranged lengthwise with one another ( refer to FIGS. 13 and 14 ). In the exemplary case, a third polysilicon film 20 is deposited by a CVD technique and then etched on the source line SL, followed by diffusion of phosphorus. The third polysilicon film 20 can be of three-layered structure of doped polysilicon-tungsten silicide-polysilicon so as to lower the resistance of a word line WL.

Figure 15:
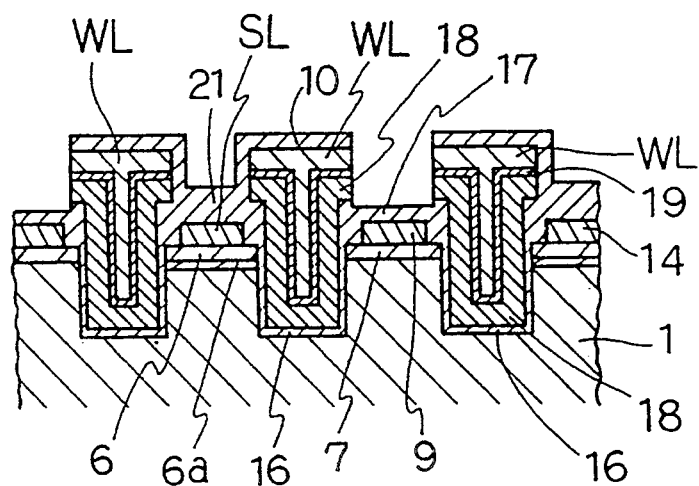
FIG. 15 is an explanatory plan view showing another embodiment of the present invention.
Figure 16:
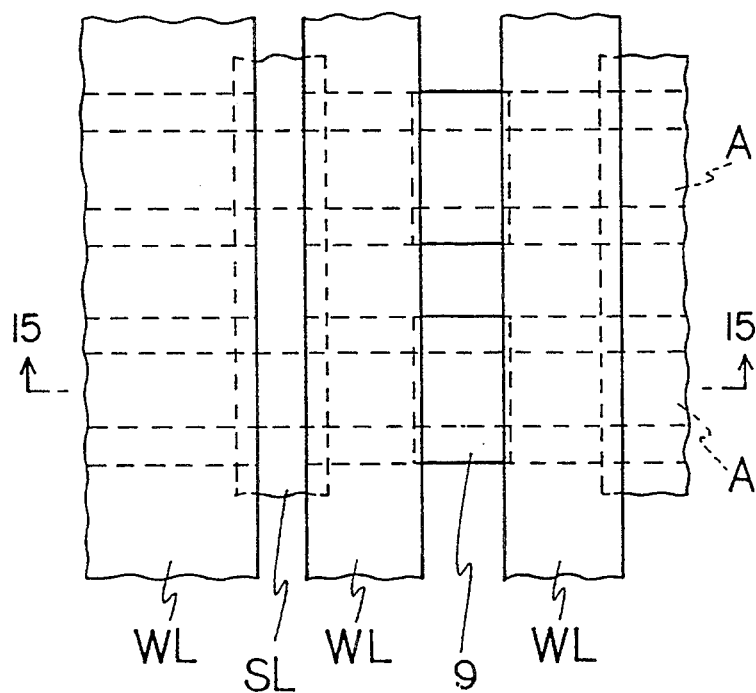
FIG. 16 is an explanatory sectional view taken along a line X—X in FIG. 15.

In turn, the surface of the third polysilicon film 20 and other polysilicon films which are exposed due to the previous patterning are oxidized, followed by etching the third polysilicon film 20, interlayer insulating film 19 and second polysilicon film 18 stacked on the drain region 7 so as to form the word line WL. Through the word line WL the control gate electrodes of the elements arranged vertically are connected with one another. In the exemplary case, oxidation is carried out by subjecting the whole semiconductor substrate 1 to a heat-treatment at 895° to 905° C. for about 15 minutes. By this oxidation, the first polysilicon film on the source region is oxidized to form a thick oxide film 21, while the surface of the second and third polysilicon films and the side walls thereof which are exposed by the previous patterning are oxidized to form an oxide film 10. Thereafter, the oxide film 10, third polysilicon film 20, interlayer insulating film 19 and second polysilicon film 18 which lie on the drain region 7 are etched so as to form the word line WL through which the control gate electrodes of the elements arranged vertically are connected with one another (refer to FIGS. 15 and 16).

Figure 17:
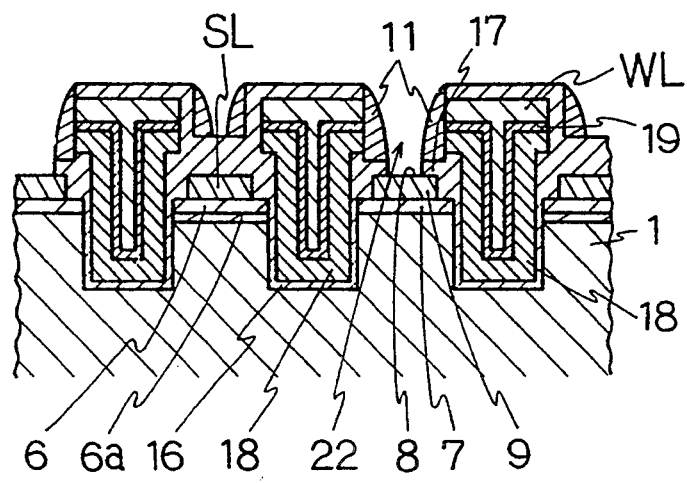
FIG. 17 is an explanatory plan view showing another embodiment of the present invention.
Figure 18:
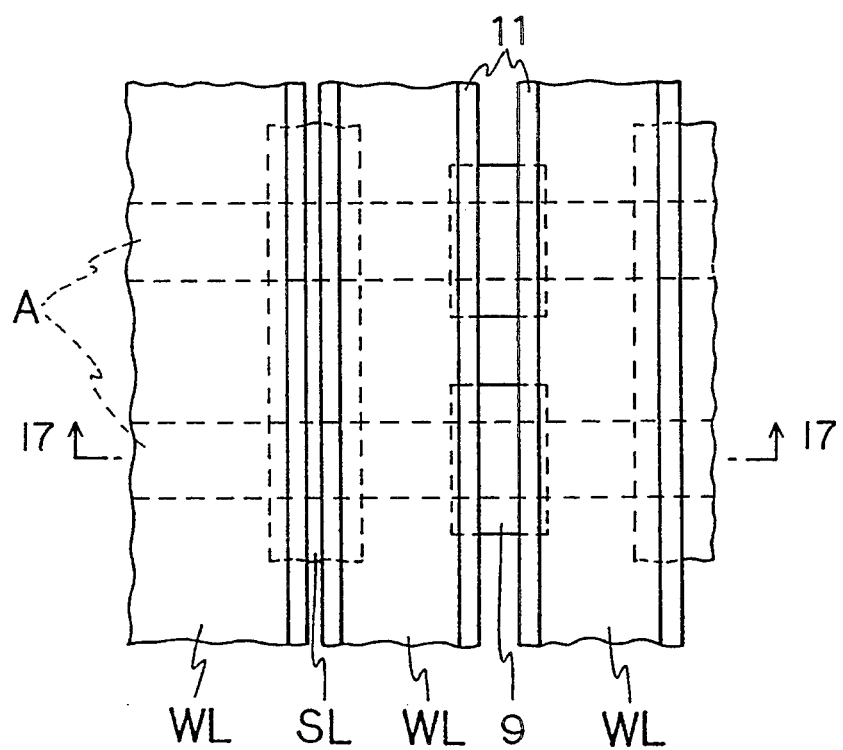
FIG. 18 is an explanatory sectional view taken along a line X—X in FIG. 17.
Figure 19:
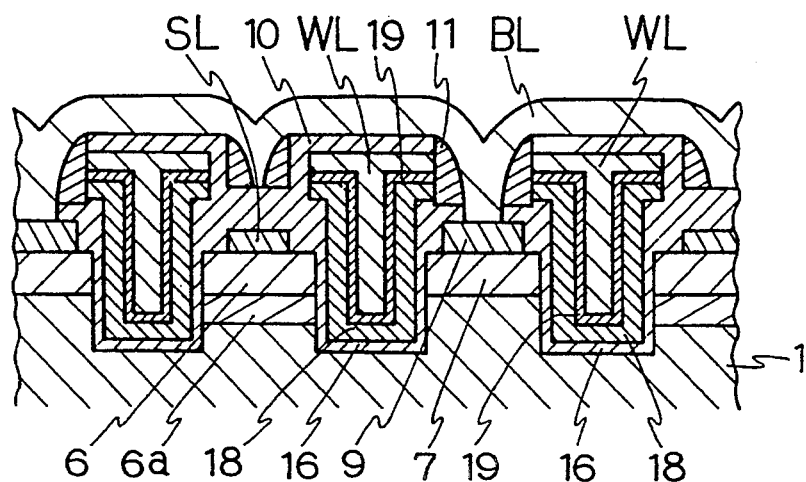
FIG. 19 is an explanatory plan view showing another embodiment of the present invention.
Figure 20:
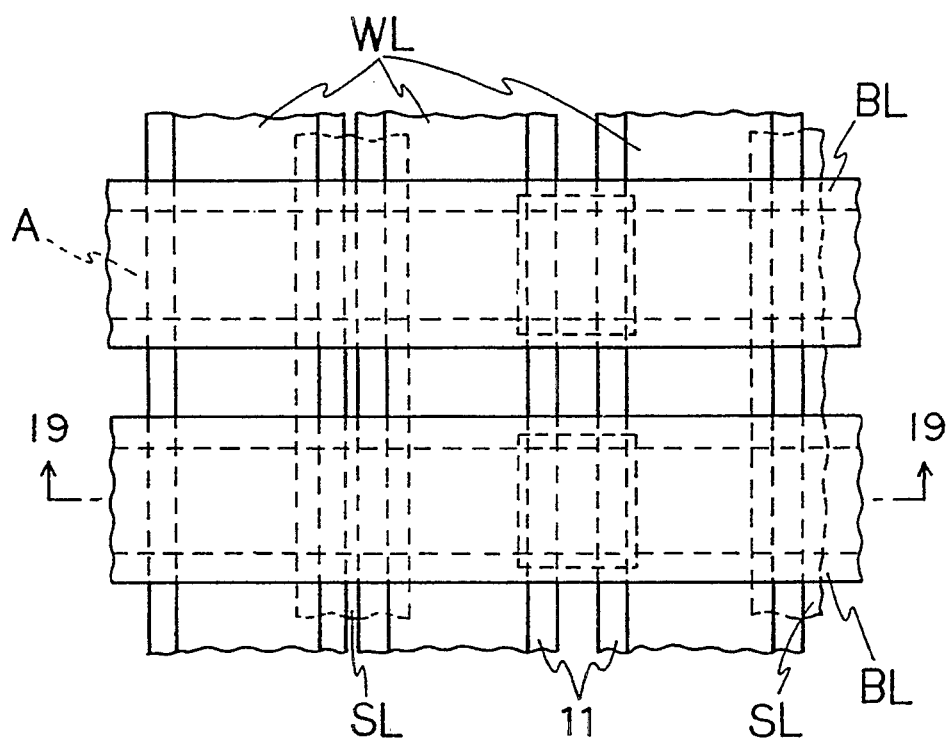
FIG. 20 is an explanatory sectional view taken along a lone X—X in FIG. 19.
Figure 21:
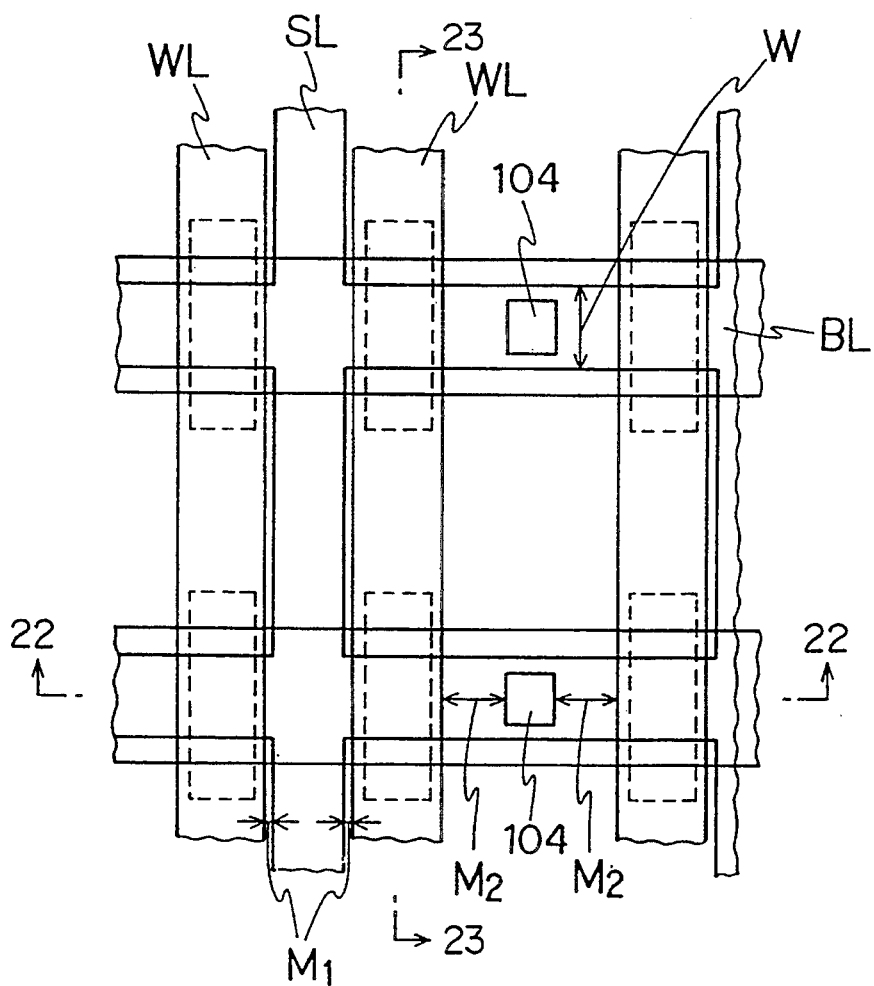
FIG. 21 is an explanatory plan view showing a conventional semiconductor memory device.
Figure 22:
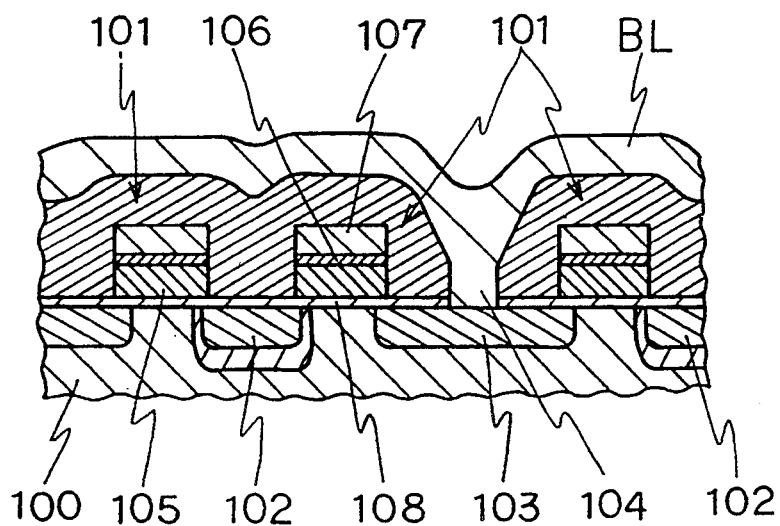
FIG. 22 is an explanatory sectional view taken along a line X—X in FIG. 14.
Figure 23:
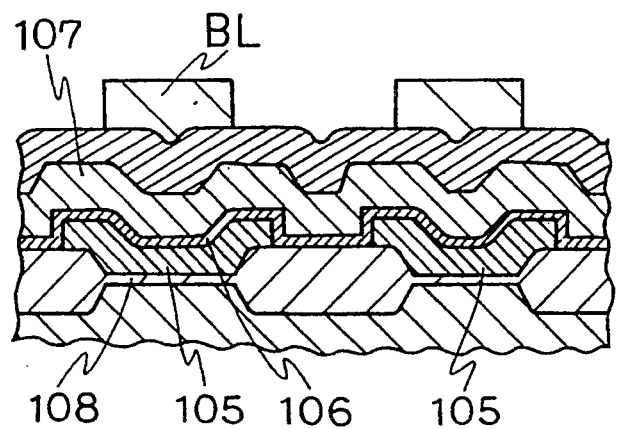
FIG. 23 is an explanatory sectional view taken along a line Y—Y in FIG. 21.

Finally, the drain electrodes 9 formed of the first polysilicon film which lies on the drain regions of the elements arranged transversely are connected with one another by means of a metal interconnection line thereby forming a bit line BL. In the exemplary case, a SiO₂ film or a like film is deposited over the whole surface by a CVD technique and then etched back by a RIE technique or the like to form a side spacer 11, and a contact hole 22 is formed into the oxide film 17 (refer to FIGS. 17 and 18). The presence of the side spacer 11 allows to form the contact hole 22, or the drain contact 8 in a self-alignment manner and offers other effects. In the formation of the drain contact 8, since there is a difference in thickness between the oxide film on the source region and that on the drain region, only the drain contact 8 can be formed without exposing the source line SL. Subsequently an alloy film of Al-Si-Cu is deposited over the whole surface and patterned to form the bit line BL (refer to FIGS. 19 and 20).

It should be noted that although in the above embodiment the memory elements arranged vertically are connected with one another through the source line and the word line while those arranged transversely through the bit line, this relationship can be reversed.

As has been described, according to the present invention each memory element can be reduced in size while the distance between adjacent word lines and that between adjacent bit lines can be shortened. Hence, a semiconductor memory device of higher integration than ever is feasible. In addition, since each memory cell per se is reduced in size without making small the thickness and area of the interlayer insulating film, there is no degradation of the device reliability due to high integration.

Though several embodiments of the present invention are described above, it is to be understood that the present invention is not limited only to the abovementioned, various changes and modificaions may be made in the invention without departing from the spirit and scope thereof.

What is claimed is:

1. A semiconductor memory device comprising:
   a plurality of nonvolatile memory elements arranged in a matrix configuration, each of the memory elements having a field effect transistor including a floating gate, an interlayer insulating film and a control gate electrode which are sequentially stacked on an insulating film covering a semiconductor substrate;
   a plurality of pairs of source and drain regions respectively formed in the semiconductor substrate on both sides of the gate electrode;
   polysilicon lines formed on the substrate, said polysilicon lines electrically connect the source regions; and
   polysilicon electrodes formed on the drain regions upon which metal lines are connected,
   wherein the floating gate, interlayer insulating film and control gate electrode being formed in a recess provided in the semiconductor substrate.

2. The semiconductor memory device of claim 1, further comprising a plurality of three-layered polysilicon structures, each having a first polysilicon film forming a source line, from one of the polysilicon lines, arranged vertically or transversely, a second polysilicon film forming said floating gate of each of said memory elements, and a third polysilicon film forming a word line through which the control gate electrodes of the memory elements arranged vertically or transversely are connected with one another.

3. The semiconductor memory device of claim 2, wherein said first and/or third polysilicon films are of a three-layered structure of doped polysilicon-tungsten silicide-polysilicon.

* * * * *